(12) United States Patent
Esaki et al.

(10) Patent No.: US 6,486,857 B1
(45) Date of Patent: Nov. 26, 2002

(54) DEFLECTION CORRECTION CIRCUIT FOR NARROWING A PULL-IN RANGE OF A VCO TO REDUCE FREQUENCY VARIATIONS IN A HORIZONTAL SYNCHRONIZING SIGNAL

(75) Inventors: Takafumi Esaki, Kanagawa (JP);
Yoshiyuki Uto, Kanagawa (JP);
Hiroshi Furukawa, Kanagawa (JP);
Yasuhiro Fukuda, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/503,177

(22) Filed: Feb. 14, 2000

(30) Foreign Application Priority Data

Feb. 12, 1999 (JP) .............................. 11-034272

(51) Int. Cl.⁷ ................................................. G09G 1/08
(52) U.S. Cl. .......................................... 345/13; 326/156
(58) Field of Search ........................ 345/204–214, 345/10–29; 327/147, 151, 156, 159, 160; 375/373, 376

(56) References Cited

U.S. PATENT DOCUMENTS

| | | | | |
|---|---|---|---|---|
| 5,517,155 A | * | 5/1996 | Yamauchi et al. | 331/1 A |
| 5,777,520 A | | 7/1998 | Kawakami | |
| 6,104,222 A | * | 8/2000 | Embree | 327/156 |
| 6,118,316 A | * | 9/2000 | Tamamura et al. | 327/156 |

FOREIGN PATENT DOCUMENTS

| | | |
|---|---|---|
| EP | 0 821 489 A2 | 1/1998 |
| JP | 61-96874 | 5/1986 |
| JP | 4-282917 | 10/1992 |
| JP | 4-282969 | 10/1992 |
| JP | 5-14760 | 1/1993 |
| JP | 5-48926 | 2/1993 |
| JP | 6-233147 | 8/1994 |
| JP | 6-308898 | 11/1994 |
| JP | 6-315094 | 11/1994 |
| JP | 08274629 A | * 10/1996 |
| JP | 9-74496 | 3/1997 |
| JP | 08125884 A | * 5/1997 |
| JP | 09130237 A | * 5/1997 |
| JP | 9-214798 | 8/1997 |
| JP | 10-49120 | 2/1998 |
| JP | 10-70671 | 3/1998 |
| JP | 10-200781 | 7/1998 |
| JP | 2944607 | 6/1999 |

* cited by examiner

*Primary Examiner*—Steven Saras
*Assistant Examiner*—Amr Awad
(74) *Attorney, Agent, or Firm*—Young & Thompson

(57) ABSTRACT

There is disclosed a phase-locked loop (PLL) circuit for use in an improved deflection correction circuit for a larger and flat display device. The PLL circuit has a phase comparator circuit, a filter, and a voltage-controlled oscillator (VCO) connected in series in this order. The output signal from the VCO is fed back to the phase comparator circuit. The PLL circuit further includes a period-detecting circuit for detecting the period of an externally applied signal and a frequency divider circuit. This frequency divider circuit divides the frequency of the output signal from the VCO according to the period detected by the period-detecting circuit and feeds the resulting signal back to the VCO.

8 Claims, 6 Drawing Sheets

DEFLECTION CORRECTION CIRCUIT FOR NARROWING A PULL-IN RANGE OF A VCO TO REDUCE FREQUENCY VARIATIONS IN A HORIZONTAL SYNCHRONIZING SIGNAL

BACKGROUND OF THE INVENTION

1. Field of the Invention

The present invention relates to a display device for displaying images and, more particularly, to a deflection correction circuit used in a display device and to a phase-locked loop circuit used in the deflection correction circuit.

2. Description of the Related Art

In recent years, display devices interfaced with computers in use have tended to have wide viewing screens with flat faces. In addition, it is a recent trend that display devices require many kinds of and delicate corrections on the viewing screen. However, the prior art deflection correction circuit is unable to satisfy these requirements because complex processing is necessary for such delicate corrections.

The prior art deflection correction circuit is described by referring to FIG. 1. In the prior art deflection correction circuit indicated by numeral 600, an analog calculator circuit 601 generates a distortion-correcting signal 106 for correcting a distortion of an image on the viewing screen. Practically, addition and multiplication are performed by the use of electrical currents in the analog calculator circuit 601 to generate the distortion-correcting signal. With this structure, the deflection correction circuit 600 cannot process complex waveforms, such as square waves and biquadratic waves in spite of the fact that complex processing is required for the delicate correction on a wide screen. Furthermore, the results of processing are easily affected from external factors and so it is difficult to accurately correct the distortion on the viewing screen.

SUMMARY OF THE INVENTION

In view of the prior art deflection correction circuit constructed as described above, it is an object of the present invention to provide a deflection correction circuit which is capable of processing complex waveforms, such as square waves and biquadratic waves, without being affected from external factors.

To achieve this object, the present invention provides the following phase-locked loop circuit, deflection correction circuit, and display device.

The present invention provides a phase-locked loop (PLL) circuit having a phase comparator circuit, a filter, and a voltage-controlled oscillator that are connected in series in this order. The output from the voltage-controlled oscillator is fed back to the phase comparator circuit. This PLL circuit is characterized in that it is equipped with a period-detecting circuit and a frequency divider circuit. The period-detecting circuit detects the period of an externally applied signal. The frequency divider circuit divides down the frequency of the output from the voltage-controlled oscillator according to the period detected by the frequency detection circuit and feeds a signal of the resulting frequency back to the voltage-controlled oscillator.

The present invention also provides a deflection correction circuit equipped with a phase-locked loop circuit for feeding the output from a voltage-controlled oscillator back to a phase comparator circuit, the deflection correction circuit acting to produce a distortion-correcting signal for correcting distortions on the viewing screen of a display device and a horizontal drive signal for controlling scan across the viewing screen in response to an externally applied horizontal synchronizing signal. The deflection correction circuit is characterized in that it comprises a period-detecting circuit for detecting the period of the horizontal synchronizing signal, a frequency divider circuit for dividing down the frequency of the output from the voltage-controlled oscillator according to the period detected by the period-detecting circuit, and a digital signal processor for producing a distortion-correcting signal according to the output from the voltage-controlled oscillator.

Furthermore, the present invention provides a deflection correction circuit equipped with a phase-locked loop circuit for feeding the output from a voltage-controlled oscillator back to a phase comparator circuit, the deflection correction circuit acting to produce a distortion-correcting signal for correcting distortions on the viewing screen of a display device and a horizontal drive signal for controlling scan across the viewing screen in response to an externally applied horizontal synchronizing signal. This deflection correction circuit is characterized in that it comprises a period-detecting circuit for detecting the period of the horizontal synchronizing signal, a transient response circuit for dividing the period detected by the period-detecting circuit into subperiods each having a predetermined time and producing such subperiods at regular intervals of time, a frequency divider circuit for dividing down the frequency of the output from the voltage-controlled oscillator according to the subperiods delivered from the transient response circuit, and a digital signal processor for producing a distortion-correcting signal according to the output from the voltage-controlled oscillator.

In addition, the present invention provides a deflection correction circuit equipped with a phase-locked loop circuit for feeding the output from a voltage-controlled oscillator back to a phase comparator circuit, the deflection correction circuit acting to produce a distortion-correcting signal for correcting distortions on the viewing screen of a display device and a horizontal drive signal for controlling scan across the viewing screen in response to an externally applied horizontal synchronizing signal. This deflection correction circuit is characterized in that it comprises a period-detecting circuit for detecting the period of the horizontal synchronizing signal, a digital signal processor for producing distortion-correcting signal according to the output from the voltage-controlled oscillator, dividing the period detected by the period-detecting circuit into subperiods each having a predetermined time and producing the subperiods at regular intervals of time, and a frequency divider circuit for dividing down the frequency of the output from the voltage-controlled oscillator according to the subperiods delivered from the digital signal processor.

Preferably, these deflection correction circuits are further equipped with a phase control circuit for producing a horizontal drive signal according to the output from the voltage-controlled oscillator and the output from the frequency divider circuit.

Further, the invention provides a display device equipped with any one of the deflection correction circuits described above.

Other objects and features of the invention will appear in the course of the description thereof, which follows.

DESCRIPTION OF THE PREFERRED EMBODIMENTS

Description will be at first made about a concept of this invention. A digital deflection correction circuit in accordance with the present invention corrects a distortion of an image on the viewing screen of a display device interfaced with a computer. This digital deflection correction circuit includes a phase-locked loop (PLL) circuit for producing a sequence of reference clock pulses having a frequency that is exempt from variations and a circuit for alleviating variations of the frequency caused to occur in a horizontal drive signal when the frequency of the applied horizontal synchronizing signal varies.

The period of the externally applied horizontal synchronizing signal is detected by a period-detecting circuit. A frequency divider circuit is set to a frequency division factor corresponding to the period of the applied horizontal synchronizing signal. This structure make it possible to narrow the pull-in range of a voltage-controlled oscillator (VCO) and, as a result, to suppress variations of the clock frequency. The clock frequency suppressed in variation is delivered to a digital signal processor (DSP) to be processed. In any event, the accuracy of processing performed by the digital signal processor (DSP) is improved.

To avoid rapid response of the phase-locked loop circuit on variation of the frequency of the applied horizontal synchronizing signal, the frequency division factor is slowly varied by a transient response circuit. Such a slow variation of the frequency division factor is effective to prevent rapid change of the frequency of the horizontal drive pulses.

(1) First Embodiment

Figure 2:
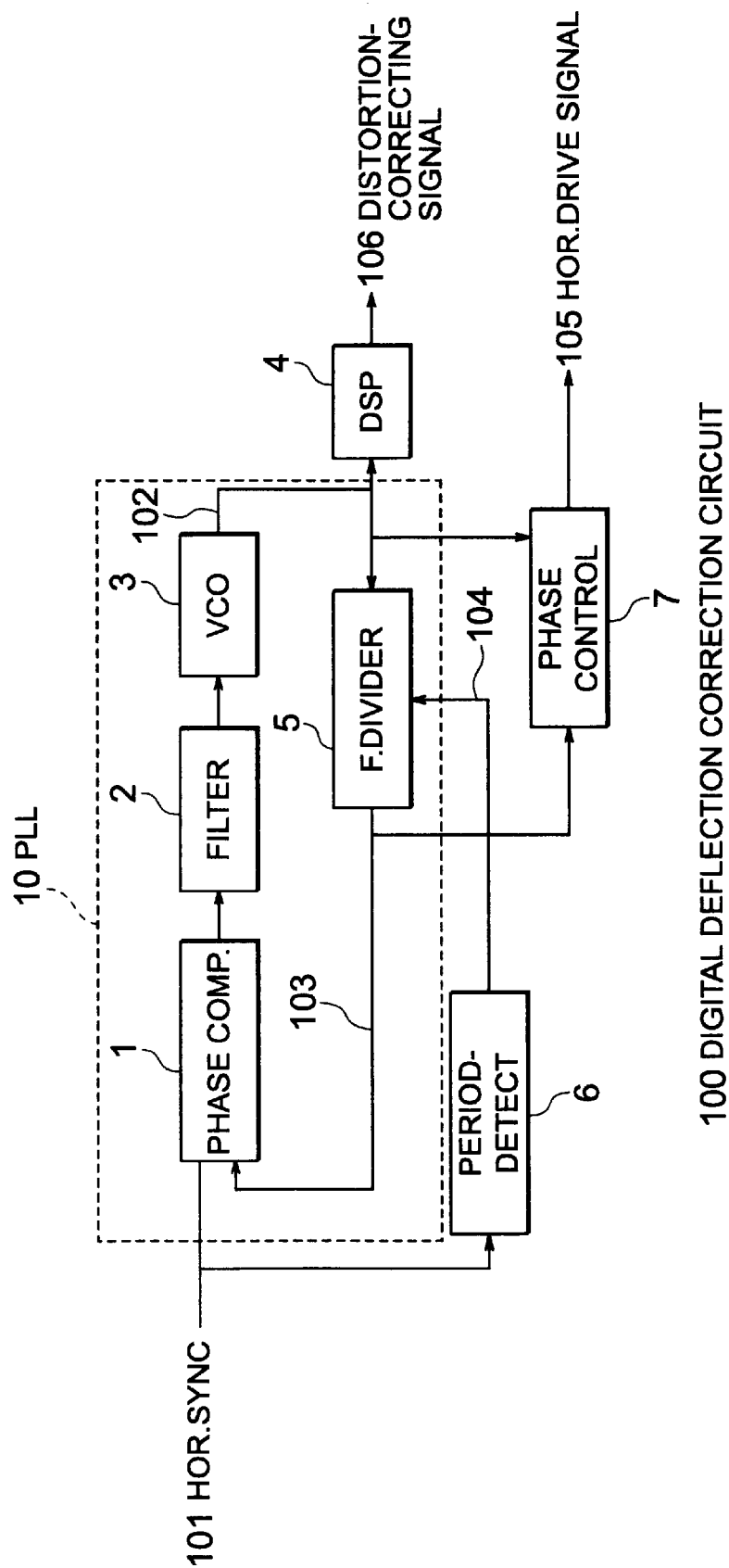
FIG. 2 is a functional block diagram of a digital deflection correction circuit 100 in accordance with a first embodiment of the present invention.

A digital deflection correction circuit 100 in accordance with a first embodiment of the present invention is described by referring to FIG. 2. This illustrated digital deflection correction circuit 100 is made up of a PLL circuit 10, a DSP 4, a period-detecting circuit 6, and a phase control circuit 7.

The PLL circuit 10 comprises a phase comparator 1, a filter 2, a voltage-controlled oscillator (VCO) 3, and a frequency divider circuit 5. The phase comparator 1 compares a horizontal synchronizing signal 101 with an output 103 sent from the frequency divider circuit 5 and produces an error signal corresponding to the phase difference between them. The filter 2 filters out higher frequencies of the error signal and supplies the signal to the VCO 3. The period-detecting circuit 6 measures the period of the horizontal synchronizing signal 101. The frequency divider circuit 5 is set at a frequency division factor 104 corresponding to the measured period. The frequency divider circuit 5 divides the frequency of the output 102 from the VCO 3 by this frequency division factor into a frequency divided signal which is produced as the output 103. In this way, the PLL circuit is phase-locked so that the externally applied horizontal synchronizing signal 101 is matched in phase with the output 103 from the frequency divider circuit.

The DSP 4 generates a distortion-correcting signal 106 necessary for a display device, using the output clock signal 102 from the VCO 3 as a reference clock signal. The phase control circuit 7 controls the phase and the duty cycle of the output signal 103 from the frequency divider circuit 5 relative to the horizontal synchronizing signal 101 and produces a horizontal drive signal 105.

The operation of the digital deflection correction circuit 100 is next described in detail. The DSP 4 produces the distortion-correcting signal 106 in response to the output clock signal 102 given from the VCO 3. It is assumed that the horizontal synchronizing signal 101 has a period depicted by a(s) and that the measuring error of the period-detecting circuit has a maximum period depicted by b(s). The ratio of the maximum value of the measuring error to the input horizontal synchronizing signal 101 in the period-detecting circuit 6 is represented by b/a.

Figure 1:
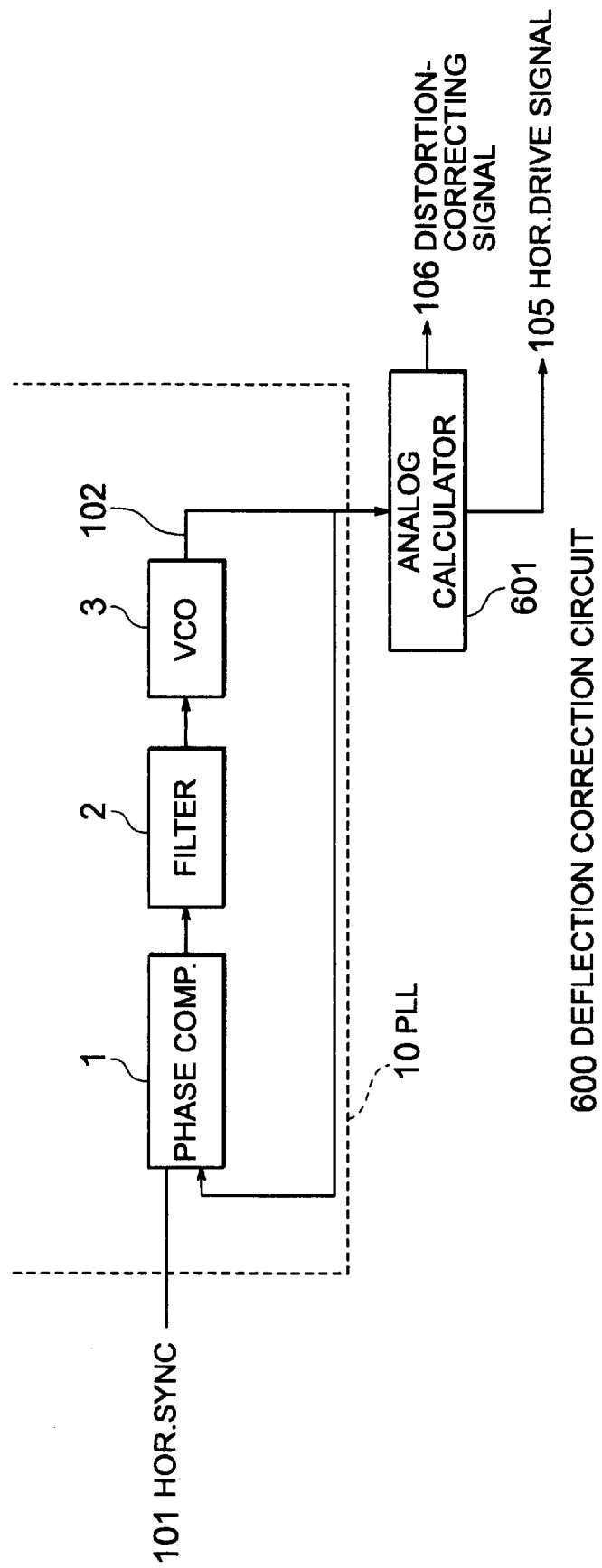
FIG. 1 is a functional block diagram of the prior art deflection correction circuit 600.

In particular, it is only necessary that the PLL circuit 10 respond to the input frequency at a ratio of b/a. When the VCO 3 has a pull-in range corresponding to this ratio, the PLL circuit can phase-lock. The prior art PLL circuit 10 illustrated in FIG. 1 has a pull-in range of tens of percents. In the present invention, the pull-in range can be narrowed to a range within 1%. Similarly, the pull-in range of the VCO 3 can be reduced to 1% or less. Accordingly, clock pulses having less frequency variations can be supplied to the DSP 4 performing calculations using the clock signal from the VCO 3. A desired waveform can be produced accurately.

(2) Second Embodiment

Figure 3:
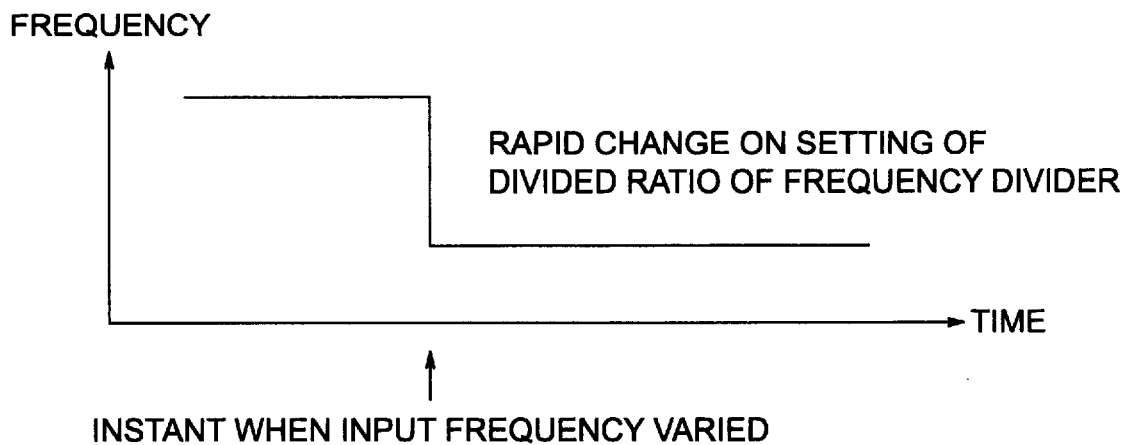
FIG. 3 is a graph in which a horizontal drive signal 105 produced from the digital deflection correction circuit 100 is plotted against a horizontal synchronizing signal 101.
Figure 4:
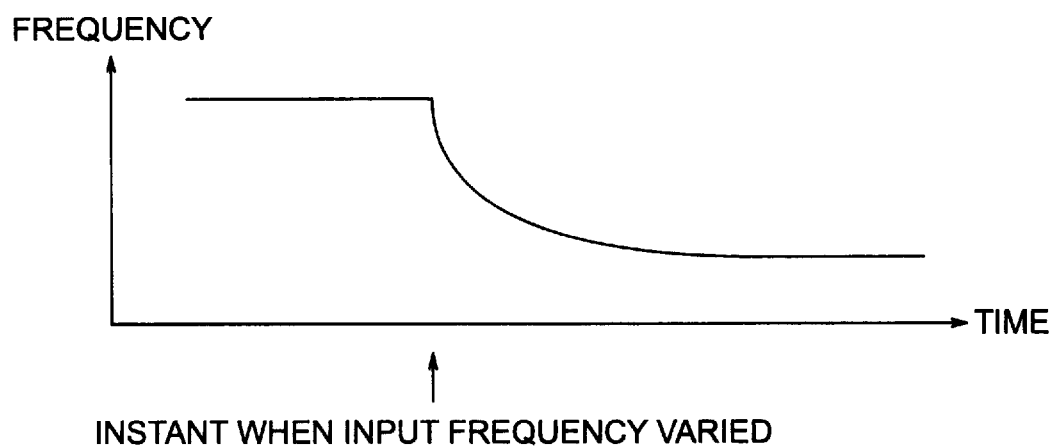
FIG. 4 is a graph in which a horizontal drive signal 105 produced from the digital deflection correction circuit 600 is plotted against a horizontal synchronizing signal 101.

In the aforementioned digital deflection correction circuit 100, if the period of the input horizontal synchronizing signal 101 varies, the period-detecting circuit 6 instantly updates the frequency division factor at which the frequency divider circuit 5 is set. Therefore, the frequency of the output 103 from the frequency divider circuit 5 follows the horizontal synchronizing signal and varies rapidly. Accordingly, as shown in FIG. 3, the frequency of the horizontal drive signal 105 produced by using the rapidly varying horizontal synchronizing signal also varies rapidly. The rapidity above is apparent in comparison with FIG. 3 and FIG. 4, which shows the horizontal drive signal of the prior art deflection correction circuit 600.

In the display device, a high-voltage resonant circuit is operated using the horizontal drive signal 105 to control the scan across the viewing screen. Therefore, if the frequency of the horizontal drive signal varies rapidly, i.e., the continuity between the H and L periods of the horizontal drive signal is interrupted, the high-voltage resonant circuit produces an abnormal voltage. In the worst case, the display device will be destroyed.

Figure 5:
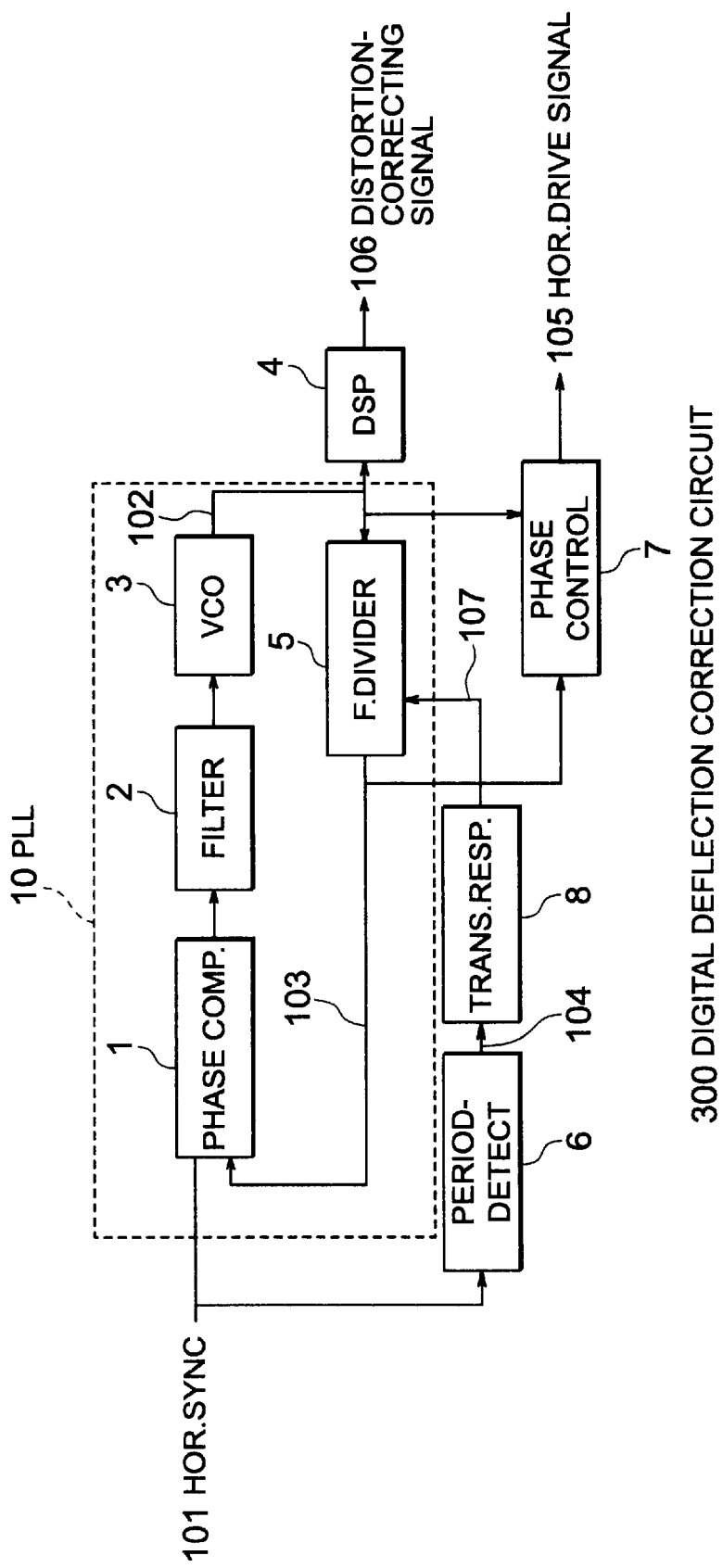
FIG. 5 is a functional block diagram of a digital deflection correction circuit 300 in accordance with a second embodiment of the invention.

A digital deflection correction circuit 300 shown in FIG. 5 and formed in accordance with a second embodiment of the invention solves this problem. In the digital deflection correction circuit 100 (FIG. 2), the output 104 from the period-detecting circuit 6 is directly applied to the frequency divider circuit 5. On the other hand, the digital deflection correction circuit 300 illustrated in FIG. 5 is equipped with a transient response circuit 8 to which the output 104 is applied. The output 107 from the transient response circuit 8 is applied to the frequency divider circuit 5.

If the output 104 from the period-detecting circuit 6 indicating the result of a detection varies rapidly, the transient response circuit 8 finely adjusts the frequency division factor at which the frequency divider circuit 5 is set.

One example of transient response of the frequency division factor to frequency variations of the horizontal synchronizing signal is given below. A is the present frequency division factor, B is the target frequency division factor after frequency variations, and C is the amount of variation of the frequency division factor tolerated by the instantaneously varying horizontal drive signal.

Figure 6:
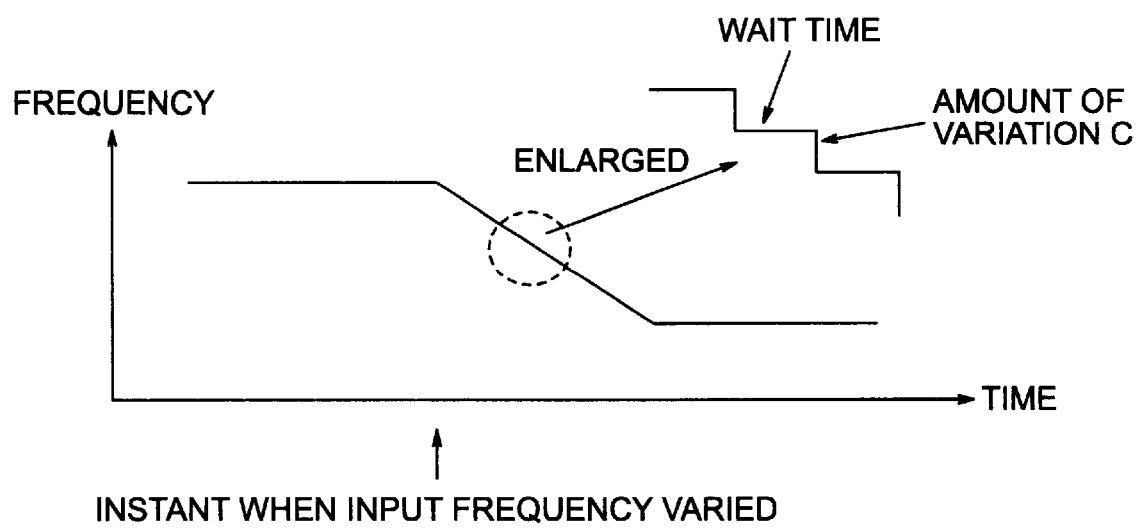
FIG. 6 is a graph in which a horizontal drive signal 105 produced from the digital deflection correction circuit 300 is plotted against a horizontal synchronizing signal 101.

Referring to FIG. 6, if the frequency of the input horizontal synchronizing signal 101 varies downward (i.e., the frequency division factor varies from a smaller value to a higher value), relation A=B+C is established if condition B−A>C is satisfied. After a lapse of a given wait time, the aforementioned comparison is repeated. In this way, repetitive calculation is performed. relation A=B is established if the condition B−A≦C holds. Calculations are performed until the target frequency division factor is reached. The amount of variation of the frequency can be controlled by appropriately setting the wait time and the value of C. Hence, the frequency division factor can be slowly varied in response to variations of the frequency of the horizontal synchronizing signal 101.

Similarly, if the frequency of the horizontal synchronizing signal 101 varies from a lower value to a higher one, the frequency division factor can be varied slowly.

(3) Third Embodiment

Figure 7:
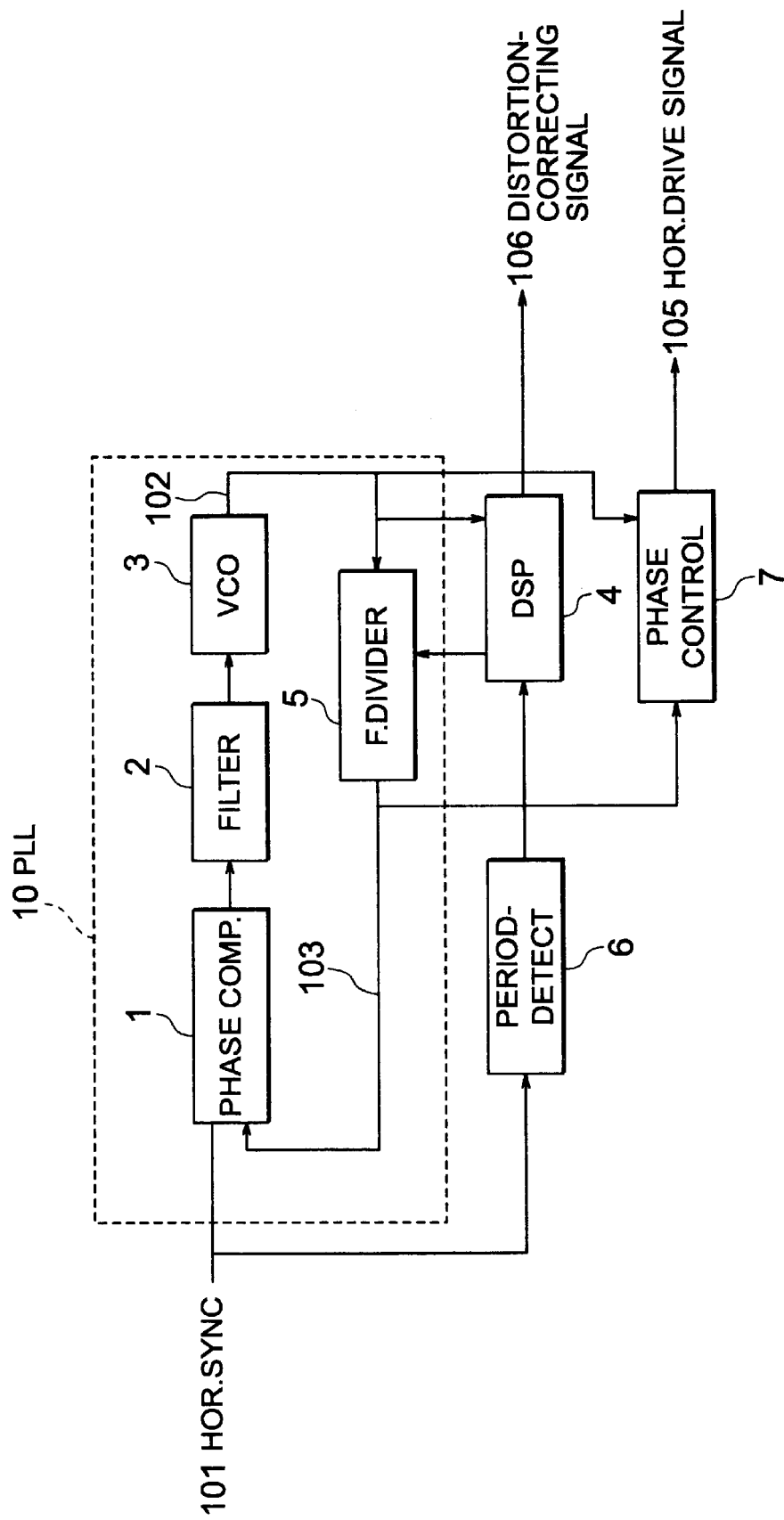
FIG. 7 is a functional block diagram of a digital deflection correction circuit 500 in accordance with a third embodiment of the invention.

The third embodiment is designed to suppress rapid variations of the horizontal drive signal used in the first embodiment, in the same way as the second embodiment. In the second embodiment, the frequency division factor at which the frequency divider circuit 5 is set is varied in a stepwise fashion. To implement this, the transient response circuit 8 is provided between the period-detecting circuit 6 and the frequency divider circuit 5. In the digital deflection correction circuit 500 in accordance with the third embodiment, the DSP 4 executes this processing by time-division techniques as illustrated in FIG. 7 instead of the provision of the transient response circuit 8.

The operation of the transient response circuit 8 can be performed by a general-purpose DSP. In other words, the DSP 4 can be operated in a manner similar to the transient response circuit 8 with the correcting signals being calculated. Hence, it is possible to prevent rapid variations of the frequency division factor determined by the period-detection circuit 6 like in the second embodiment of this invention.

A first advantage is that it is possible to narrow the frequency pull-in range of the VCO 3 by enhancing the accuracy of the frequency detection circuit 6. When the range becomes narrow, the output clock signal of the VCO 3 varies less. The DSP performs processing using the output clock signal. Consequently, the deflection correction circuit of this invention can perform accurate calculations.

A second advantage is that the horizontal drive signal 105 does not vary rapidly even if the frequency of the horizontal synchronizing signal 101 changes rapidly. This is because the DSP which is operable as transient response circuit can be set to an appropriate amount of variation C of the frequency division factor and the wait time. As a result, the circuit according to the third embodiment of the present invention can control variations of the horizontal drive signal within the tolerance level of each display devices to be connected with the circuit.

While embodiments of the present invention have been described, the invention is not limited thereto. Of course, changes and modifications to them are possible within the scope of knowledge possessed by a person skilled in the art.

What is claimed is:

1. A deflection correction circuit having a phase-locked loop circuit for feeding an output signal from a voltage-controlled oscillator back to a preceding circuit stage, said deflection correction circuit producing a distortion-correcting signal for correcting distortions on a viewing screen of a display device and a horizontal drive signal for controlling scan across the viewing screen in response to an externally applied horizontal synchronizing signal, said deflection correction circuit comprising:

a period-detecting circuit for detecting period of said horizontal synchronizing signal;

a transient response circuit for dividing the period detected by said period-detecting circuit into sub-periods each having a predetermined time and delivering said sub-periods at regular intervals;

a frequency divider circuit for dividing down the frequency of said output signal from said voltage-controlled oscillator according to the sub-periods delivered from said transient response circuit; and a digital signal processor for producing said distortion-correcting signal according to said output signal from said voltage-controlled oscillator.

2. The deflection-correcting circuit of claim 1, wherein there is further provided a phase control circuit for producing said horizontal drive signal according to the output signal from said voltage-controlled oscillator circuit and the output signal from said frequency divider circuit.

3. A display device equipped with the deflection-correcting circuit of claim 2.

4. A display device equipped with the deflection-correcting circuit of claim 1.

5. A deflection correction circuit having a phase-locked loop circuit for feeding an output signal from a voltage-controlled oscillator back to a preceding circuit stage, said deflection correction circuit producing a distortion-correcting signal for correcting distortions on a viewing screen of a display device and a horizontal drive signal for controlling scan across the viewing screen in response to an externally applied horizontal synchronizing signal, said deflection correction circuit comprising:

a period-detecting circuit for detecting period of said horizontal synchronizing signal;

a digital signal processor for producing said distortion-correcting signal according to the output signal from said voltage-controlled oscillator, dividing the period detected by said period-detecting circuit into subperiods each having a predetermined time and delivering said subperiods at regular intervals; and a frequency divider circuit for dividing down the frequency of said output signal from said voltage-controlled oscillator according to the subperiods delivered from said digital signal processor.

6. The deflection correction circuit of claim 5, wherein there is further provided a phase control circuit for producing said horizontal drive signal according to the output signal from said voltage-controlled oscillator circuit and the output signal from said frequency divider circuit.

7. A display device equipped with the deflection correction circuit of claim 6.

8. A display device equipped with the deflection correction circuit of claim 5.

* * * * *